(12) United States Patent
Nishihara et al.

(10) Patent No.: US 8,212,308 B2
(45) Date of Patent: Jul. 3, 2012

(54) NONVOLATILE SEMICONDUCTOR FLASH MEMORY

(75) Inventors: Kiyohito Nishihara, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 12/618,058

(22) Filed: Nov. 13, 2009

(65) Prior Publication Data

US 2010/0127320 A1  May 27, 2010

(30) Foreign Application Priority Data

Nov. 21, 2008 (JP) ................. 2008-298533

(51) Int. Cl.
*H01L 29/788* (2006.01)
(52) U.S. Cl. .............. 257/321; 257/E29.304; 438/261
(58) Field of Classification Search ............ 257/321, 257/E29.304; 438/261
See application file for complete search history.

(56) References Cited

U.S. PATENT DOCUMENTS

| | | | |
|---|---|---|---|
| 6,265,754 B1 * | 7/2001 | Sung .................. | 257/516 |
| 6,475,915 B1 * | 11/2002 | Wang .................. | 438/689 |
| 6,720,610 B2 | 4/2004 | Iguchi et al. | |
| 7,005,714 B2 | 2/2006 | Ozawa et al. | |
| 7,026,684 B2 | 4/2006 | Sakuma et al. | |
| 7,247,916 B2 | 7/2007 | Ozawa et al. | |
| 7,387,934 B2 | 6/2008 | Ozawa et al. | |
| 7,618,862 B2 * | 11/2009 | Lee .................. | 438/257 |
| 2007/0262371 A1 | 11/2007 | Meguro | |

FOREIGN PATENT DOCUMENTS

JP  2001-168306  6/2001

* cited by examiner

*Primary Examiner* — Howard Weiss
(74) *Attorney, Agent, or Firm* — Oblon, Spivak, McClelland, Maier & Neustadt, L.L.P.

(57) ABSTRACT

Two diffusion layers are provided in an element area. A tunnel insulating film is provided on the surface of the element area between the two diffusion layers. A charge storage layer is provided on the tunnel insulating film. A first insulator provided on the upper surface of the charge storage layer. An inter-electrode insulating film provided on the first insulator, on the side surface of the charge storage layer in a first direction and on the isolation insulating film. And a control gate electrode extends in the first direction and covers the charge storage layer via the first insulator and the inter-electrode insulating film. The first insulator is thicker than the inter-electrode insulating film, and the inter-electrode insulating film has a first slit on the first insulator.

22 Claims, 12 Drawing Sheets

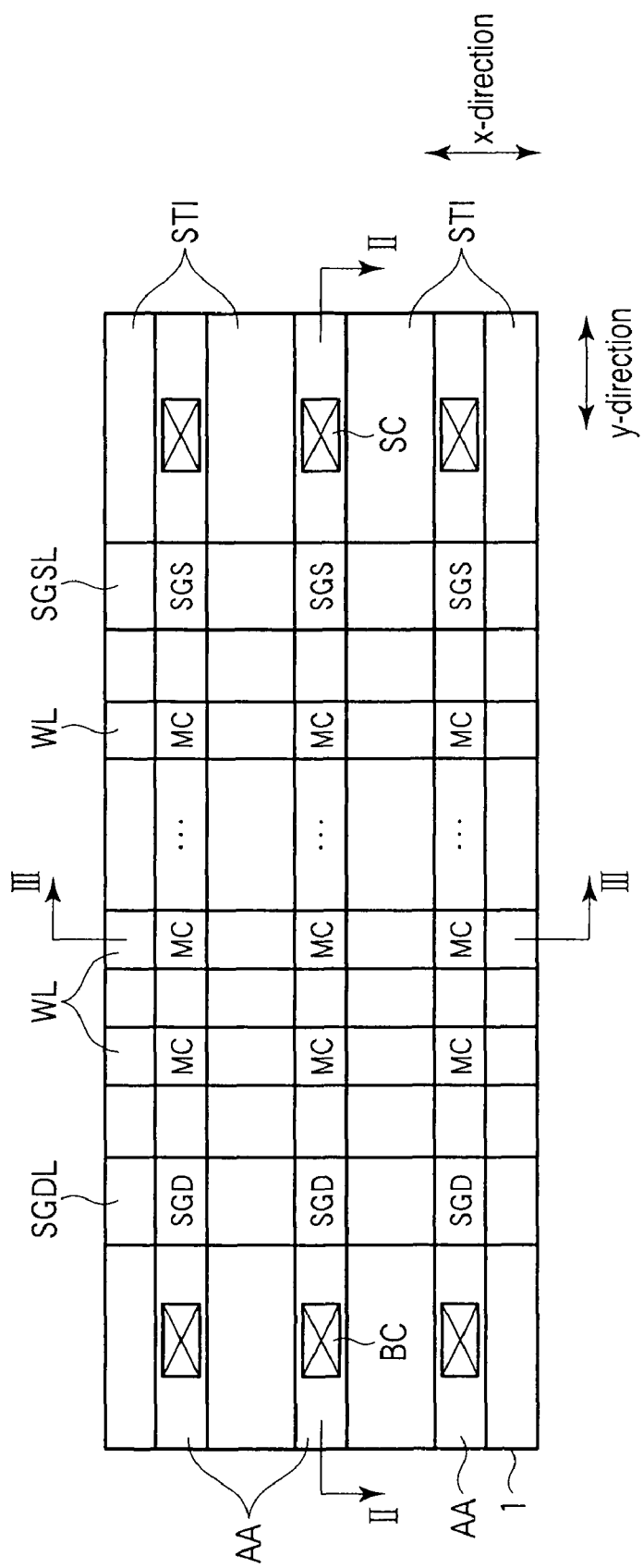
F I G. 1

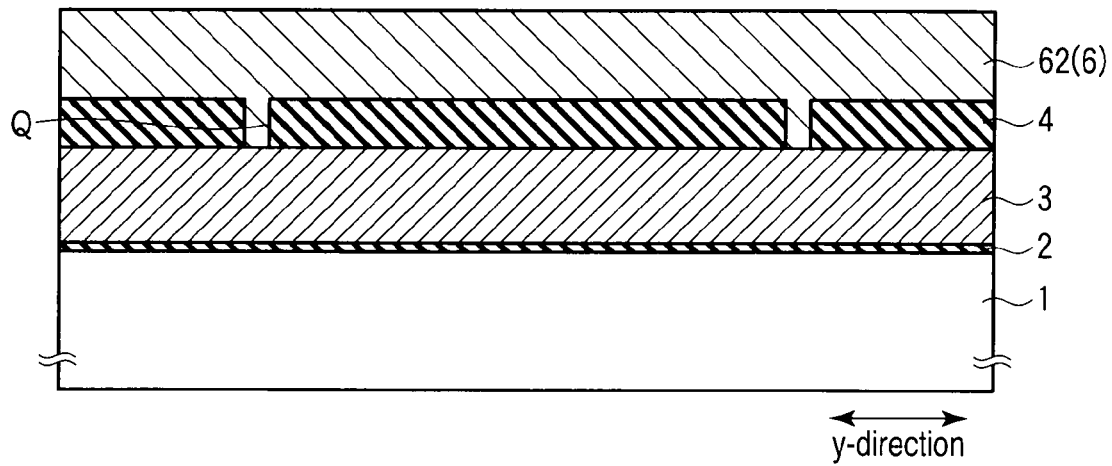
F I G. 9
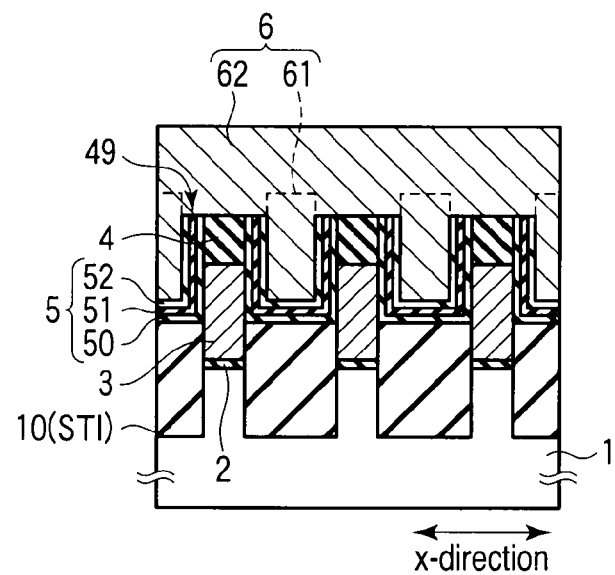
F I G. 10

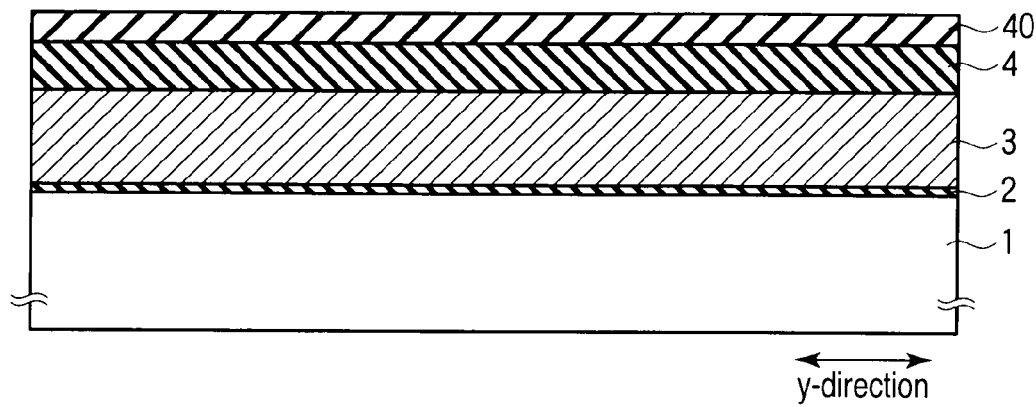
F I G. 11
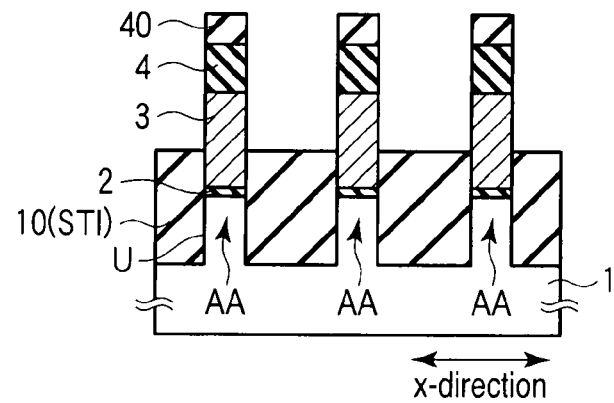
F I G. 12

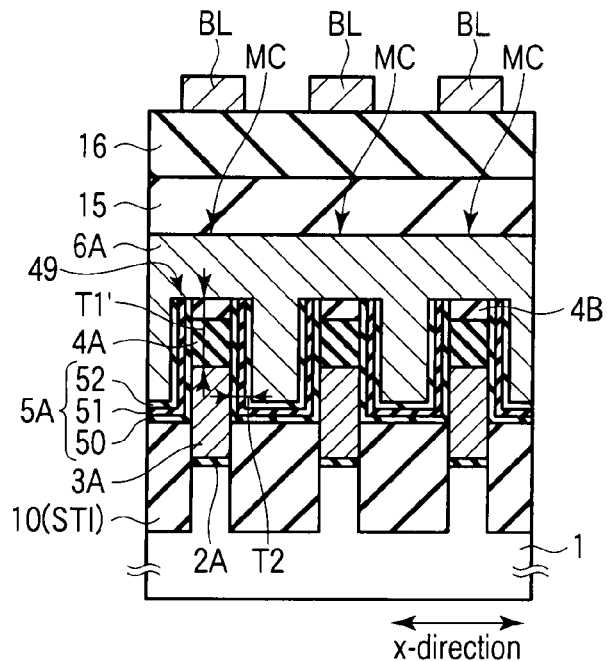
F I G. 13
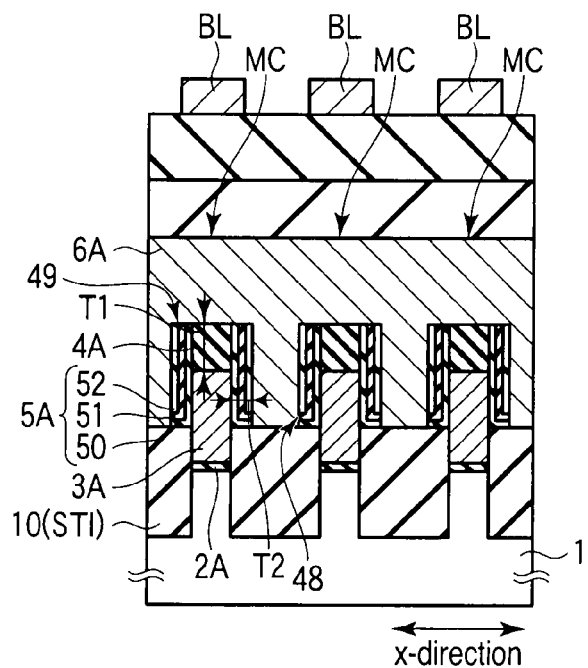
F I G. 14

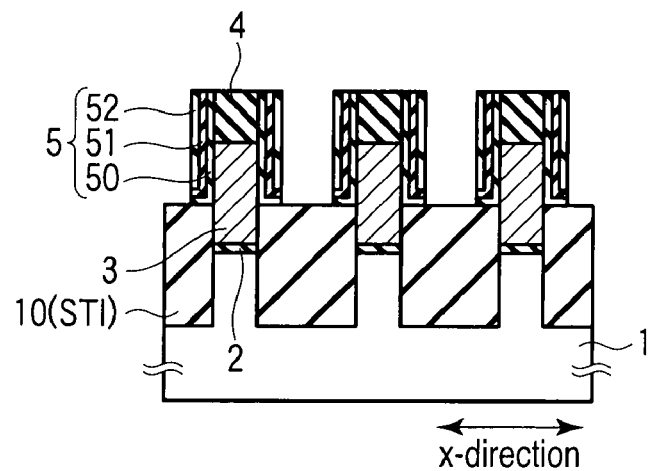
F I G. 15
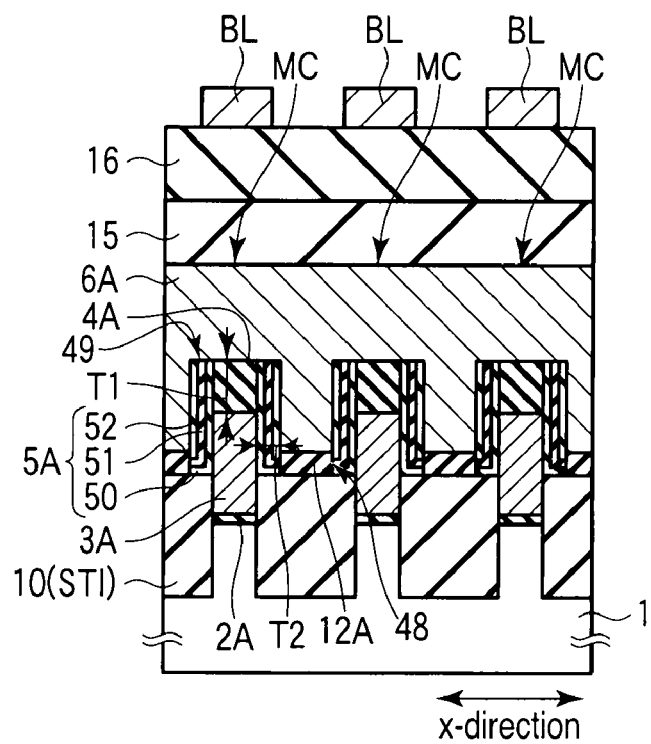
F I G. 16

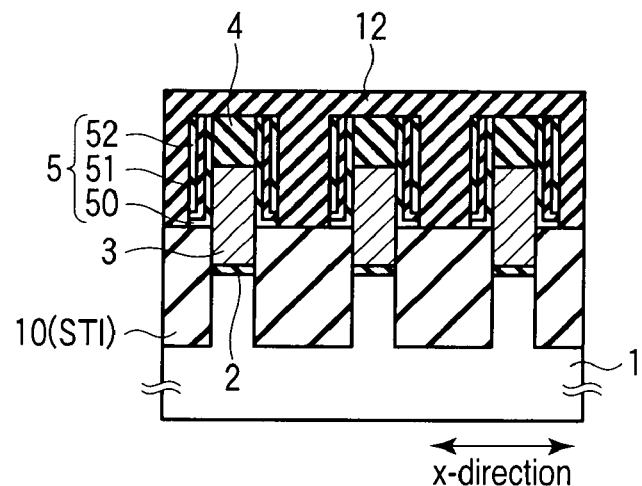
F I G. 17
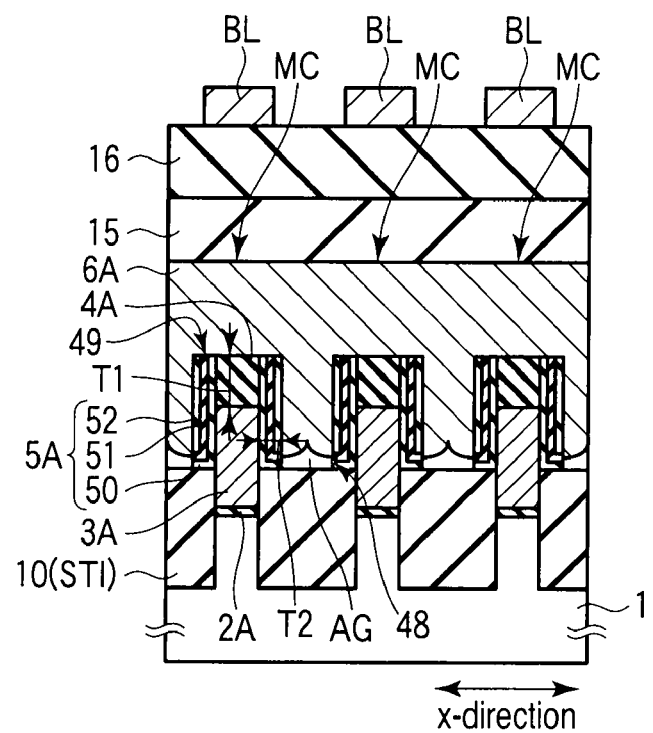
F I G. 18

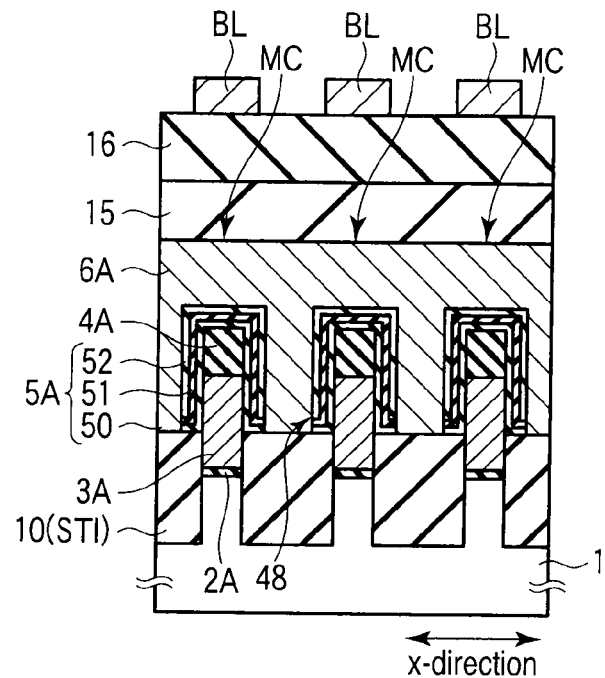
F I G. 21
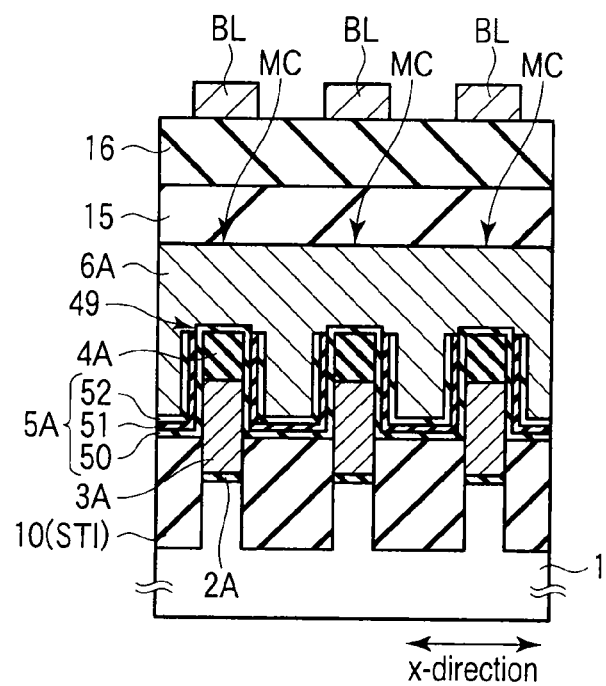
F I G. 22

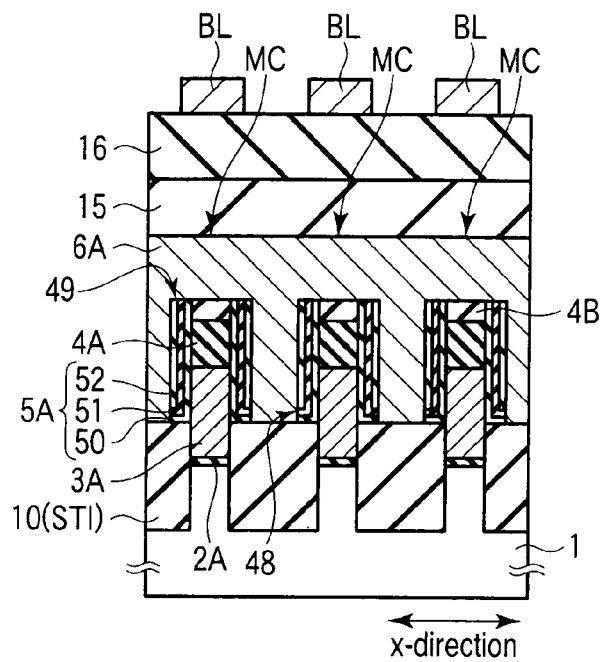
F I G. 23
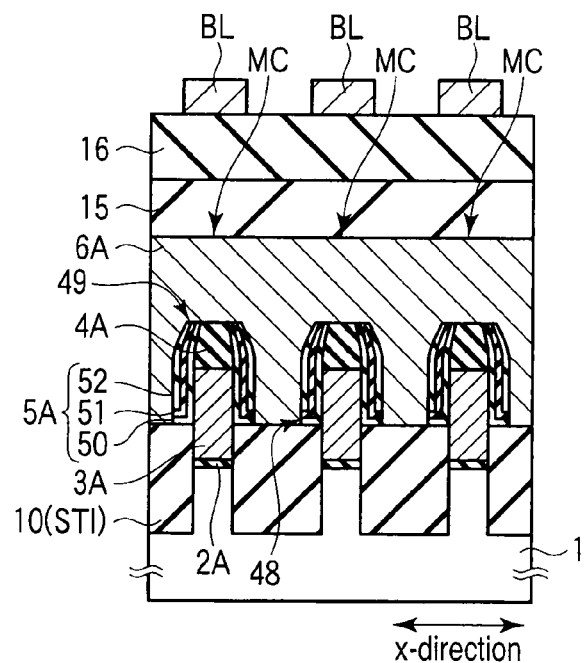
F I G. 24

NONVOLATILE SEMICONDUCTOR FLASH MEMORY

CROSS-REFERENCE TO RELATED APPLICATIONS

This application is based upon and claims the benefit of priority from prior Japanese Patent Application No. 2008-298533, filed Nov. 21, 2008, the entire contents of which are incorporated herein by reference.

BACKGROUND OF THE INVENTION

1. Field of the Invention

The present invention relates to a nonvolatile semiconductor memory, and more particularly, it relates to a flash memory.

2. Description of the Related Art

A nonvolatile semiconductor memory such as a NAND flash memory has the advantage of high capacity and nonvolatility, and has recently begun to be used in various electronic devices such as a portable audio device.

In the NAND flash memory, memory cells are increasingly shrunk to provide a greater storage capacity. Along with the shrinking of the memory cells, degradation of characteristics of memory cells that had not matter in conventional element sizes has started to be obvious in shrunk memory cells. This degradation has a great effect on the memory cells and on the whole operation of the flash memory.

For example, in a normal flash memory, memory cells adjacent in the extending direction of a word line share a control gate electrode as the word line and an inter-electrode insulating film. It is known that when the inter-electrode insulating film has a stacked structure, electrons move in the interface between two stacked insulating films (see Jpn. Pat. Appln. KOKAI Publication No. 2001-168306). The movement of this charge varies the threshold voltage (data) of the memory cells adjacent in the extending direction of the word line, which degrades data retention characteristics of the memory cells. The distance between the adjacent memory cells is also reduced because of the shrinking of the memory cells, and the degradation of the data retention characteristics is therefore also obvious.

BRIEF SUMMARY OF THE INVENTION

A nonvolatile semiconductor memory according to an embodiment of the present invention comprising: an element area between two isolation insulating films adjacent in a first direction; two diffusion layers provided in the element area; a tunnel insulating film provided on the surface of the element area between the two diffusion layers; a charge storage layer provided on the tunnel insulating film; a first insulator provided on the upper surface of the charge storage layer; an inter-electrode insulating film provided on the first insulator, on the side surface of the charge storage layer in the first direction and on the isolation insulating film; and a control gate electrode which extends in the first direction and which covers the charge storage layer via the first insulator and the inter-electrode insulating film, wherein the first insulator is thicker than the inter-electrode insulating film, and the inter-electrode insulating film has a first slit on the first insulator.

A nonvolatile semiconductor memory according to an embodiment of the present invention comprising: an element area between two isolation insulating films adjacent in a first direction; two diffusion layers provided in the element area; a tunnel insulating film provided on the surface of the element area between the two diffusion layers; a charge storage layer provided on the tunnel insulating film; a first insulator provided on the upper surface of the charge storage layer; an inter-electrode insulating film provided on the first insulator, on the side surface of the charge storage layer in the first direction and on the isolation insulating film; and a control gate electrode which extends in the first direction and which covers the charge storage layer via the first insulator and the inter-electrode insulating film, wherein the first insulator is thicker than the inter-electrode insulating film.

BRIEF DESCRIPTION OF THE SEVERAL VIEWS OF THE DRAWING

FIG. 1 is a planar view for explaining the structure of a memory cell array of a flash memory;

FIG. 9 is a sectional view for explaining one step of the manufacturing method according to the first embodiment;

FIG. 10 is a sectional view for explaining one step of the manufacturing method according to the first embodiment;

FIG. 11 is a sectional view for explaining one step of the manufacturing method according to the first embodiment;

FIG. 12 is a sectional view for explaining one step of the manufacturing method according to the first embodiment;

FIG. 13 is a sectional view showing one example of the structure of the memory cell;

FIG. 14 is a sectional view for explaining the structure of a flash memory according to a second embodiment;

FIG. 15 is a sectional view for explaining one step of a manufacturing method according to the second embodiment;

FIG. 16 is a sectional view for explaining the structure of a flash memory according to a third embodiment;

FIG. 17 is a sectional view for explaining one step of a manufacturing method according to the third embodiment;

FIG. 18 is a sectional view for explaining the structure of a flash memory according to a fourth embodiment;

FIG. 21 is a sectional view for explaining the modification;

FIG. 22 is a sectional view for explaining the modification;

FIG. 23 is a sectional view for explaining the modification; and

FIG. 24 is a sectional view for explaining the modification.

DETAILED DESCRIPTION OF THE INVENTION

Embodiments of the present invention will hereinafter be described in detail with reference to the drawings.

1. Overview

The embodiments of the present invention relate to a nonvolatile semiconductor memory, and more particularly, to a flash memory. In the embodiments of the present invention, a memory cell forming the flash memory has a stacked gate structure in which a control gate electrode is stacked on a floating gate electrode.

An inter-electrode insulating film is provided on the side surface of the floating gate electrode of the memory cell in a channel width direction (first direction). The side surface of the floating gate electrode in the channel width direction is covered with the control gate electrode via the inter-electrode insulating film.

A first insulator is provided on the upper surface of the floating gate electrode, and this insulator is interposed between the upper surface of the floating gate electrode and the control gate electrode. The first insulator is thicker than the inter-electrode insulating film.

In the memory cell of the embodiments of the present invention, the insulator is provided between the upper part of the floating gate electrode and the control gate electrode, such that the coupling capacitance between the upper part of the floating gate electrode and the control gate electrode is reduced.

Therefore, according to the embodiments of the present invention, there is hardly any degradation of current leakage of the memory cell or variation of the coupling capacitance due to the shape of the upper part of the floating gate electrode.

Furthermore, in the embodiments of the present invention, the inter-electrode insulating film has a slit. This slit is provided in the inter-electrode insulating film on at least one of the insulator provided on the floating gate electrode and an isolation insulating film.

Thus, the provision of the slit in the inter-electrode insulating film inhibits the movement of a charge in the inter-electrode insulating film. As a result, degradation of the data retention characteristics of the memory cell due to the movement of the charge is reduced.

Moreover, when the slit is provided in the inter-electrode insulating film on the isolation insulating film, there is no inter-electrode insulating film between two memory cells adjacent in the channel width direction. As a result, parasitic capacitance attributed to the inter-electrode insulating film is reduced, and a mutual interference between two memory cells adjacent in the channel width direction is inhibited.

As described above, according to the nonvolatile semiconductor memory in the embodiments of the present invention, degradation of the characteristics of the memory cell can be inhibited.

2. Embodiments

(1) First Embodiment (a) Structure

Figure 2:
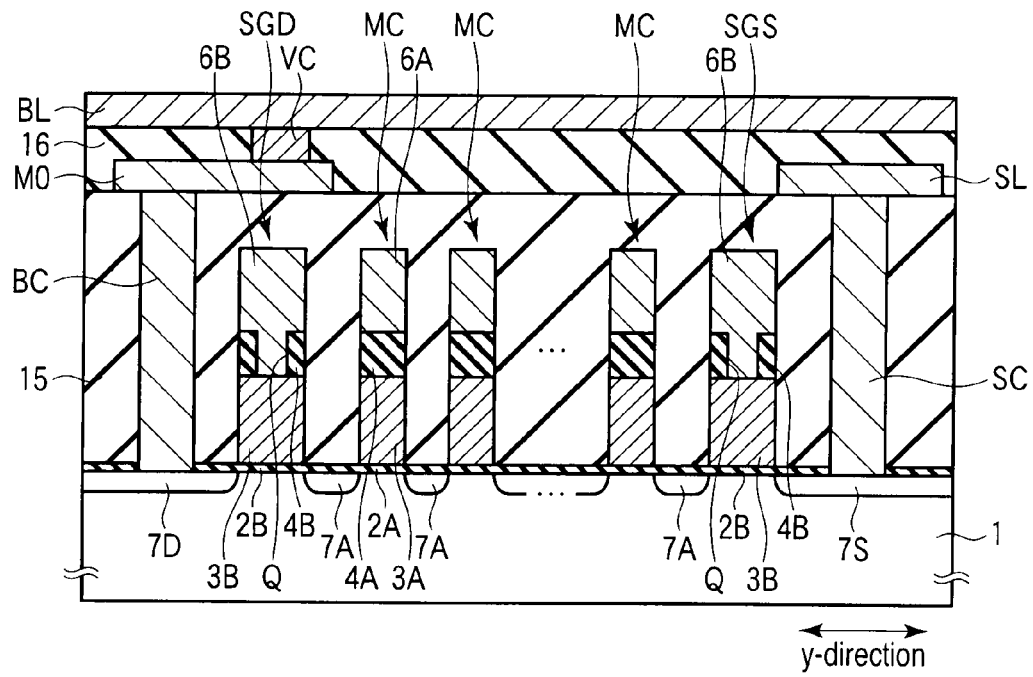
FIG. 2 is a sectional view along line II-II in FIG. 1.
Figure 3:
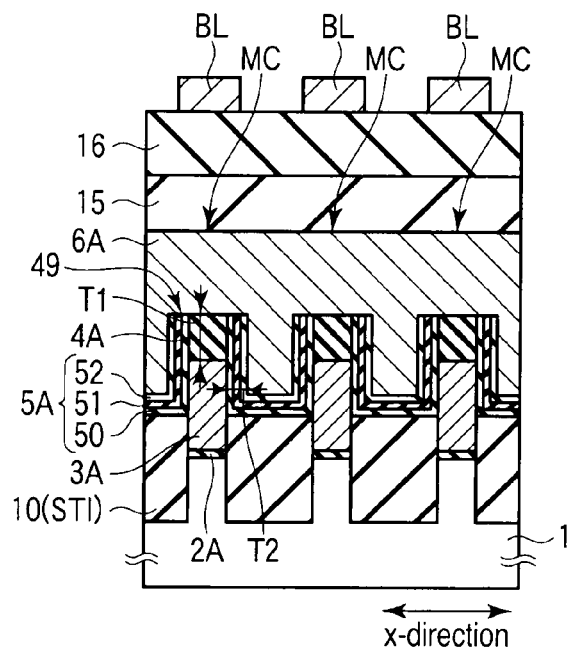
FIG. 3 is a sectional view along line III-III in FIG. 1.

The structure of a nonvolatile semiconductor memory according to the first embodiment of the present invention is described with FIGS. 1 to 3. In the present embodiment, a flash memory is described as an example of the nonvolatile semiconductor memory.

FIG. 1 shows a planar view of a memory cell array of the flash memory. FIG. 2 is a sectional view along line II-II in FIG. 1. FIG. 3 is a sectional view along line III-III in FIG. 1. In addition, FIG. 2 corresponds to the channel length direction (y-direction) of memory cells MC, and FIG. 3 corresponds to the channel width direction (x-direction) of the memory cells MC.

As shown in FIG. 1, in the memory cell array of the flash memory, the surface area of a semiconductor substrate 1 is constituted of an isolation area STI, and an element area (active area) AA interposed between two isolation areas adjacent in the x-direction (first direction). The isolation area STI and the element area AA extend in the y-direction (second direction). A plurality of memory cells MC and select transistors SGD, SGS are provided on the element area AA. An isolation insulating film having, for example, a shallow trench isolation (STI) structure, is provided in the isolation area STI.

The plurality of memory cells MC are arranged on the element area AA, and are connected in series along the y-direction perpendicular to the x-direction. The plurality of memory cells connected in series will hereinafter be referred to as a memory cell string.

Furthermore, the select transistors SGD, SGS are disposed at one end of the memory cell string and the other end, and are connected in series to the memory cells adjacent thereto. The configuration including the select transistors SGD, SGS connected to one end of the memory cell string and the other end will hereinafter be referred to as a memory cell unit.

The plurality of memory cells MC adjacent in the x-direction are connected to word lines WL1 to WLn extending in the x-direction, respectively. The select transistors SGD, SGS adjacent in the x-direction are connected to select gate lines SGDL, SGSL extending in the x-direction, respectively.

One bit line (not shown) extending in the y-direction is connected to one end of one memory cell unit via a bit line contact BC. Moreover, one source line (not shown) extending in the x-direction is connected to other end of one memory cell unit via a source line contact SC.

As shown in FIGS. 2 and 3, the memory cell MC used in the present embodiment is a metal-insulator-semiconductor (MIS) transistor of a stacked gate structure in which a control gate electrode 6A is stacked on a floating gate electrode 3A.

A well area (not shown) is provided in the semiconductor substrate 1 (element area AA). The memory cell MC is formed on this well area.

A gate insulating film 2A is provided on the surface of the semiconductor substrate 1. In the memory cell MC, the gate insulating film 2A functions as a tunnel insulating film. The gate insulating film 2A of the memory cell MC will hereinafter be referred to as a tunnel insulating film 2A.

The floating gate electrode 3A is provided on the tunnel insulating film 2A on the surface of the semiconductor substrate 1. The floating gate electrode 3A functions as a charge storage layer for retaining data stored in the memory cells, and is made of, for example, a polysilicon film.

In the memory cells MC adjacent in the x-direction, the floating gate electrode 3A of these memory cells are electrically insulated from each other by an isolation insulating film 10 embedded in the semiconductor substrate 1. The upper end of the isolation insulating film 10 is set back closer to the semiconductor substrate 1 than the upper end of the floating gate electrode 3A.

A first insulator 4A is provided on the upper surface of the floating gate electrode 3A. Moreover, an inter-electrode insulating film 5A is provided on the side surface of the floating gate electrode 3A along the x-direction. In addition, the inter-electrode insulating film 5A is also provided on the isolation insulating film 10.

The inter-electrode insulating film 5A has a slit 49. In the example shown in FIGS. 2 and 3, the slit 49 provided in the inter-electrode insulating film 5A is provided on the upper surface of the insulator 4A. Owing to this slit 49, the upper surface of the insulator 4A is not covered with the inter-electrode insulating film 5A in the memory cell MC.

Furthermore, the inter-electrode insulating film 5A has a stacked structure (multilayer structure) including, for example, a plurality of insulating films 50, 51, 52. In the example shown in FIGS. 2 and 3, the inter-electrode insulating film 5A has a structure in which the insulating film 51 is interposed between two insulating films 50, 52. The thickness T2 of the inter-electrode insulating film 5A of the stacked structure is, for example about 8 to 20 nm.

For example, silicon nitride (SiN) or a high-dielectric film such as aluminum oxide ($Al_2O_3$), hafnium oxide ($HfO_2$), tantalum oxide ($Ta_2O_5$), lanthanum oxide ($La_2O_3$), $LaLiO_3$, zirconium oxide ($ZrO_2$) or yttrium oxide ($Y_2O_3$) is used for the insulating film 51. In addition, nitrogen or silicon may be further contained in the high-dielectric film made of the oxide film mentioned above.

The insulating films 50, 52 are, for example, insulating films lower in dielectric constant than the insulating film 51. Silicon oxide films are mainly used for the insulating films 50, 52. In addition, when the insulating film 51 is a high-dielectric film, silicon nitride films may be used for the insulating films 50, 52.

Although the inter-electrode insulating film 5A has a three-layer structure in the present embodiment, it goes without saying that the inter-electrode insulating film 5A is not limited thereto and may have a structure in which a plurality of insulating films are stacked in four or more layers. Moreover, the inter-electrode insulating film 5A may be a single-layer high-dielectric film.

At least one of silicon oxide, silicon nitride and aluminum oxide is used for the insulator 4A. In addition, these materials are not exclusively used for the insulator 4A, and other insulating materials may be used. The thickness T1 of the insulator 4A is greater than the thickness T2 of the inter-electrode insulating film 5A. When a silicon nitride film is used for the insulator 4A, its thickness T1 is, for example, in the range of 20 to 40 nm, and is greater than the thickness of the inter-electrode insulating film 5A. In addition, the inter-electrode insulating film 5A, for example, is provided on the side surface of the insulator 4A in the x-direction.

Figure 4:
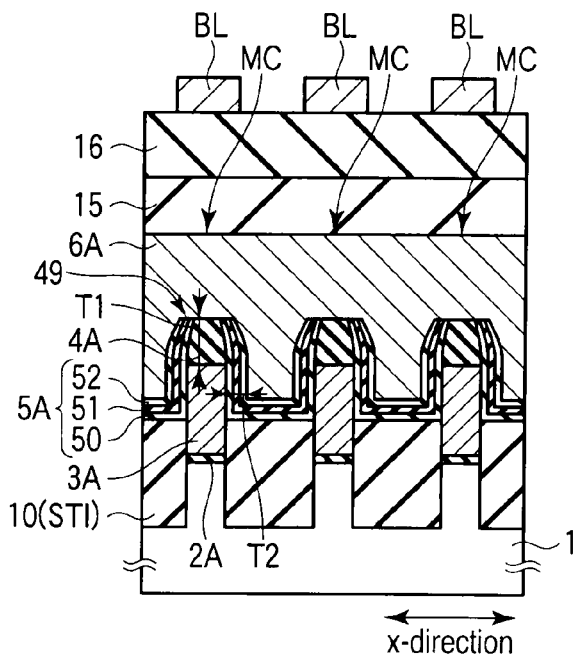
FIG. 4 is a sectional view showing one example of the structure of a memory cell.

Here, as shown in FIG. 4, depending on the conditions for the processing of the isolation insulating film 10 and the inter-electrode insulating film 5A, the center of the upper surface of the insulator 4A may be planar and the end of the upper surface of the insulator 4A may be formed into a curved surface, so that the insulator 4A may have a trapezoidal (tapered) shape in which the length of the upper surface in x-direction is smaller than that of the bottom surface in x-direction. In this case, the thickness T1 of the insulator 4A ranges from the lower surface of the insulator 4A to the uppermost position (bit line BL side) of the upper surface of the insulator 4A in the vertical direction to the surface of the substrate 1. Moreover, the thickness T2 of the inter-electrode insulating film 5A is the thickness of the inter-electrode insulating film 5A formed on the side surface of the floating gate electrode 3A in the parallel direction to the surface of the substrate 1.

The control gate electrode 6A is provided on the insulator 4A and the inter-electrode insulating film 5A. The control gate electrode 6A covers the side surface of the floating gate electrode 3A along the x-direction via the inter-electrode insulating film 5A. In addition, as describe above, the slit 49 is provided in the inter-electrode insulating film 5A on the insulator 4A, so that the control gate electrode 6A is in direct contact with the upper surface of the insulator 4A.

A silicide film, for example, is used for the control gate electrode 6A to reduce its electric resistance. However, the control gate electrode 6A is not limited to this, and may have a single-layer structure of a polysilicon film or may have a double-layer structure having a polysilicon film and a silicide film stacked on this polysilicon film (polycide structure). For example, a tungsten silicide film ($WSi_2$), a molybdenum silicide film ($MoSi_2$), a cobalt silicide film ($CoSi_2$), a titanium silicide film ($TiSi_2$) or a nickel silicide film ($NiSi_2$) is used for the silicide film.

The control gate electrode 6A functions as the word line WL, and is shared by the memory cells adjacent in the x-direction. Therefore, the control gate electrode 6A is not only provided on the floating gate electrode 3A but also provided on the isolation insulating film 10 via an inter-electrode insulating film 5A.

A diffusion layer 7A is provided in the semiconductor substrate 1, and functions as a source/drain area of the memory cell MC. The diffusion layer 7A will hereinafter be referred to as a source/drain diffusion layer 7A. The source/drain diffusion layer 7A is shared by the memory cells MC adjacent to each other in the y-direction (channel length direction). Thus, the plurality of memory cells MC are connected in series, such that one memory cell string is formed.

The select transistors SGD, SGS are provided at one end of the plurality of memory cells MC connected in series (memory cell string) and the other end.

The select transistors SGD, SGS are formed in a process simultaneous with the memory cells MC. Therefore, similarly to the memory cell MC, the select transistor SGD, SGS has a gate structure in which an upper gate electrode 6B is stacked on the lower gate electrode 3A via an insulator 4B and an inter-electrode insulating film 5B. A lower gate electrode 3B has the same configuration as the floating gate electrode 3A, and the upper gate electrode 6B has the same configuration as the control gate electrode 6A.

However, in the select transistors SGD, SGS, the insulator 4B has an opening Q, and the upper gate electrode 6B and the lower gate electrode 3B on a gate insulating film 2B are connected together via the opening Q.

The diffusion layers (source/drain diffusion layer) 7A, 7D, 7S function as source/drain areas of the select transistors SGD, SGS. The select transistors SGD, SGS share the source/drain area 7A with the memory cells MC adjacent in the y-direction. Thus, the plurality of memory cells MC and the select transistors SGD, SGS are connected in series along the y-direction, such that one memory cell unit is formed.

In the select transistor SGD provided on the drain side of the memory cell unit, its diffusion layer 7D is connected to the bit line contact portion BC embedded in an interlayer insulating layer 15. Further, the bit line contact BC is connected to the bit line BL via a metal interconnect M0 and a via contact VC provided in an interlayer insulating layer 16.

Furthermore, in the select transistor SGS provided on the source side of the memory cell unit, its source diffusion layer 7S is connected to a source line SL via a source line contact SC embedded in the interlayer insulating layer 15.

As shown in FIGS. 2 and 3, the flash memory as the nonvolatile semiconductor memory according to the first embodiment of the present invention is characterized in that the first insulator 4A is provided on the upper surface of the floating gate electrode 3A and that the thickness T1 of the insulator 4A is greater than the thickness T2 of the inter-electrode insulating film 5A. As a result, the intensity of an electric field applied across the upper part of the floating gate electrode 3A and the control gate electrode 6A can be reduced as compared with the case where the inter-electrode insulating film 5A with thickness T2 is formed in direct contact with the upper surface of the floating gate electrode 3A.

Moreover, in the present embodiment, the inter-electrode insulating film 5A is provided with the slit 49 on the insulator 4A. In the example shown in FIGS. 2 and 3, the slit 49 of the inter-electrode insulating film 5A is provided on the insulator 4A. In this example, the inter-electrode insulating film 5A is disconnected on the upper surface of the insulator 4A by the slit and the inter-electrode insulating film 5A is removed from the upper surface of the insulator 4A.

In the present embodiment, the coupling capacitance produced between the upper part of the floating gate electrode 3A and the control gate electrode 6A opposite thereto is much smaller than the coupling capacitance produced between the side part of the floating gate electrode 3A and the control gate electrode 6A opposite thereto.

In the present embodiment, the coupling capacitance for injecting a charge into or releasing a charge from the floating gate electrode (charge storage layer) 3A is ensured by the capacitance produced between the side part of the floating gate electrode 3A in the x-direction (channel width direction) and the control gate electrode 6A opposite thereto. In addition, in order to ensure the coupling capacitance of the memory cells, it is preferable to use the thick floating gate electrode 3A to increase the area in which the side surface of the floating gate electrode 3A in the x-direction faces the control gate electrode 6A.

As described above, in the memory cell MC of the flash memory in the present embodiment, data is programmed/erased mainly by using the coupling capacitance of the side part of the floating gate electrode 3A. Therefore, even when the curvature radius of the upper part of the floating gate electrode 3A is decreased by the shrinking of the memory cell, the insulator 4A is formed between the control gate electrode 6A and the upper part of the floating gate electrode 3A so that the concentration of the electric field in the upper part of the floating gate electrode 3A can be inhibited. As a result, the intensity of an electric field applied across the upper part of the floating gate electrode 3A and the control gate electrode 6A can be reduced.

Consequently, in the present embodiment, degradation of the current leakage of the memory cell due to shrink of the memory cell can be prevented.

Furthermore, in the memory cell of the present embodiment, the upper part of the floating gate electrode 3A does not make a great contribution to the coupling capacitance of the memory cell. This makes it possible to reduce the variation of the coupling capacitance of the plurality of memory cells provided in the memory cell array due to the variation in the shape of the upper part of the floating gate electrode 3A. Thus, in the present embodiment, it is possible to inhibit the variation of the element characteristics of the memory cell such as a programming characteristics and erasing characteristics of the memory cell.

Furthermore, when a high-dielectric film is used for the insulating film 51, the insulating film 51 having a high dielectric constant is removed from the upper surface of the insulator 4A, so that the variation of the coupling capacitance due to this high-dielectric film can be reduced, and the variation of the element characteristics of the memory cell can be inhibited.

Thus, according to the nonvolatile semiconductor memory (flash memory) in the first embodiment of the present invention, degradation of the element characteristics of the memory cell due to the shrink can be inhibited. Moreover, according to the present embodiment, variation of the element characteristics can also be inhibited.

(b) First Manufacturing Method

One example of a method of manufacturing the nonvolatile semiconductor memory (flash memory) according to the first embodiment of the present invention is described below with FIGS. 2 to 9. FIGS. 2, 5, 7 and 9 show the section of a memory cell array in the y-direction. Moreover, FIGS. 3, 6, 8 and 10 show the section of the memory cell array in the x-direction.

Figure 5:
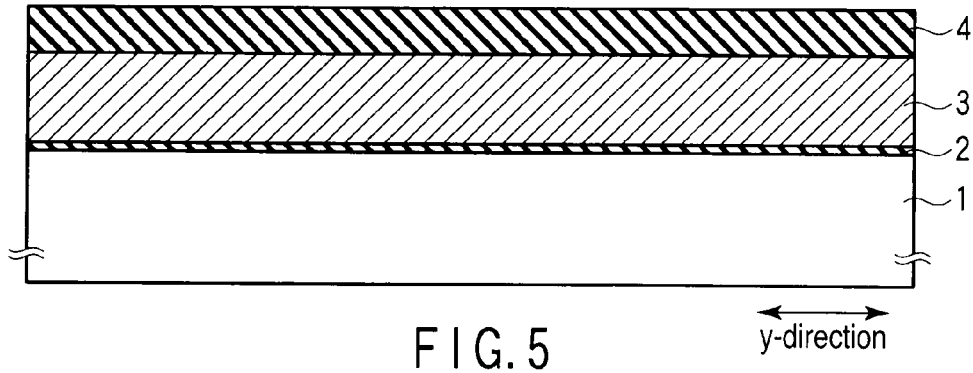
FIG. 5 is a sectional view for explaining one step of a manufacturing method according to a first embodiment.
Figure 6:
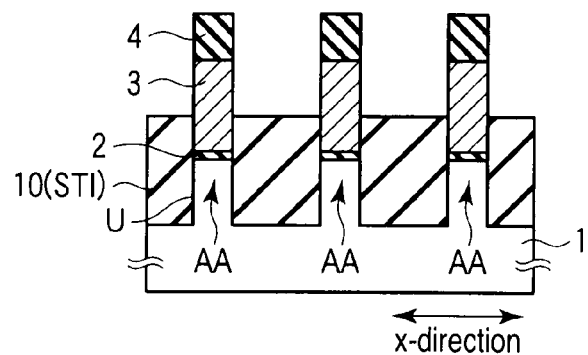
FIG. 6 is a sectional view for explaining one step of the manufacturing method according to the first embodiment.

As shown in FIGS. 5 and 6, an insulating film 2 as a tunnel insulating film of a memory cell is formed on the surface of a semiconductor substrate 1 by, for example, the thermal oxidation method. This insulating film 2 also is used as a gate insulating film of a select transistor.

On the insulating film 2, a first conducting layer 3 as a floating gate electrode of the memory cell and as a lower gate electrode of the select transistor is formed by, for example, the chemical vapor deposition (CVD) method. This conducting layer 3 is, for example, a polysilicon layer.

Then, a first insulator 4 is deposited on the conducting layer 3 by, for example, the CVD method. For the insulator 4, at least one of a silicon oxide film, a silicon nitride film and an aluminum oxide film, for example, can be used. In addition, these materials are not exclusively used for the insulator 4, and other insulating materials may be used. The insulator 4 is formed so that it is thicker than an inter-electrode insulating film to be formed in a subsequent step. For example, when a silicon nitride film is used for the insulator 4, its thickness T1 is, for example, in the range of 20 to 50 nm.

Furthermore, the insulator 4 is patterned by a photolithographic technique. On the basis of a formed pattern, the conducting layer 3, the insulating film 2 and the semiconductor substrate 1 are sequentially etched by, for example, the reactive ion etching (RIE) method, and a trench U extending in the y-direction is formed in the semiconductor substrate 1. An isolation insulating film 10 is embedded in this trench U, so that an isolation area STI and element areas AA partitioned by the area STI are formed.

Then, the upper surface of the isolation insulating film 10 is planarized by the chemical mechanical polishing (CMP) method to coincide with the upper surface of the insulator 4. After the planarization, the upper surface of the isolation insulating film 10 is etched back by, for example, the RIE method. Thus, the upper surface of the isolation insulating film 10 is set back closer to the semiconductor substrate 1 than the upper surface of the first conducting layer 3 as the floating gate electrode, and the side surface of the conducting layer 3 in the x-direction is exposed.

Here, after the planarization, the upper part of the insulator 4 may also be etched by the etch-back using, for example, the RIE method. In this case, the end of the upper surface of the insulator 4 is formed into a curved surface. Then, a later-described insulating film 5 on the insulator 4 is etched so that the upper part of the insulator 4 may be substantially planar. As a result, the insulator 4 has a substantially trapezoidal shape, as shown in FIG. 4.

Figure 7:
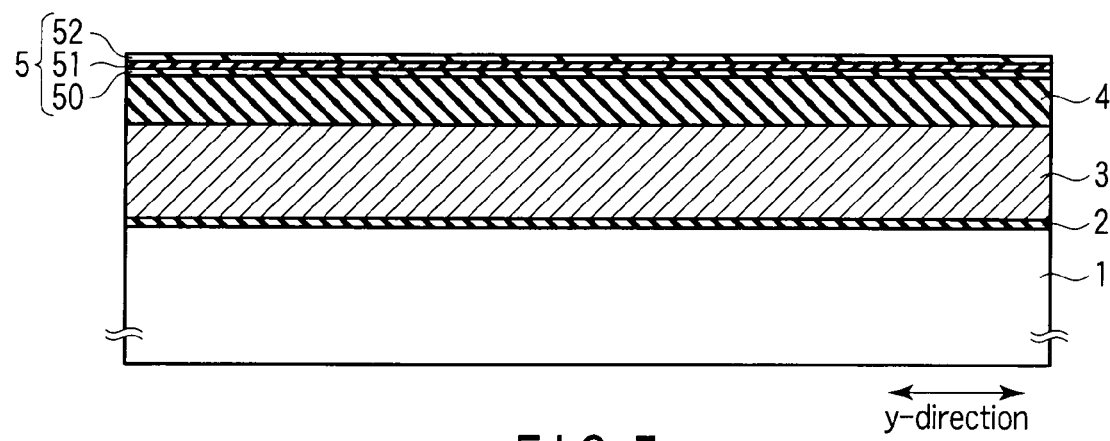
FIG. 7 is a sectional view for explaining one step of the manufacturing method according to the first embodiment.
Figure 8:
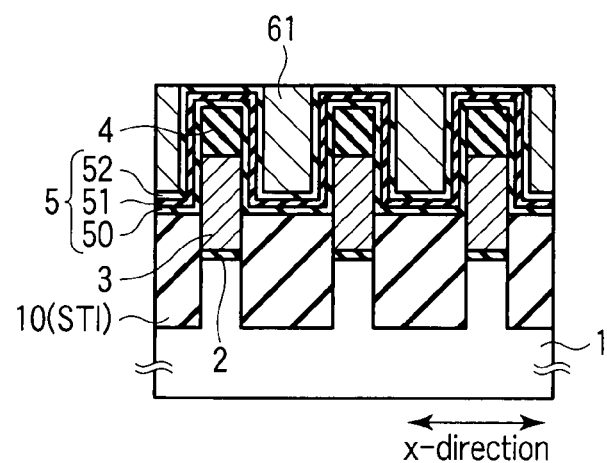
FIG. 8 is a sectional view for explaining one step of the manufacturing method according to the first embodiment.

As shown in FIGS. 7 and 8, the insulating film 5 as the inter-electrode insulating film is formed on the insulator 4 and on the isolation insulating film 10. The insulating film 5 covers the side surface of the conducting layer 3 exposed from the isolation insulating film 10 in the x-direction. The insulating film 5 has, for example, a stacked structure. The insulating film 5 of the stacked structure as the inter-electrode insulating film of the memory cell will hereinafter be referred to as a stacked insulating film 5.

In the example shown in FIGS. 7 and 8, the stacked insulating film 5 has a three-layer structure. The stacked insulating film 5 has a structure in which an insulating film 51 having a high dielectric constant is interposed between two insulating films 50, 52. The material used for the insulating film 51 is such that the dielectric constant of the insulating film 51 is higher than that of the insulating films 50, 52.

The lowermost insulating film (first insulating film) 50 of the stacked insulating film 5 is formed on the isolation insulating film 10, on the insulator 4 and on the side surface of the conducting layer 3 in the x-direction by, for example, the CVD method. For example, a silicon oxide film is used for the insulating film 50.

The insulating film 51 is formed on the insulating film 50 by, for example, the atomic layer deposition (ALD) or CVD method. For example, silicon nitride (SiN) or a high-dielectric film (high-k film) is used for the insulating film 51. For example, aluminum oxide ($Al_2O_3$), hafnium oxide ($HfO_2$), tantalum oxide ($Ta_2O_5$), lanthanum oxide ($La_2O_3$), $LaLiO_3$, zirconium oxide ($ZrO_2$) or yttrium oxide ($Y_2O_3$) is used for the high-dielectric film. In addition, nitrogen or silicon may be further contained in the oxide film forming the high-dielectric film.

The uppermost insulating film (second insulating film) 52 of the stacked insulating film 5 is formed on the insulating film 51 by, for example, the CVD method. For example, a silicon oxide film is used for the insulating film 52. Here, the stacked insulating film 5 is formed so that its thickness is smaller than the thickness of the insulator 4. For example, the thickness of the stacked insulating film 5 is about 10 nm.

Then, a second conducting layer 61 is formed on the stacked insulating film 5. The upper surface of the conducting layer 61 is selectively etched by, for example, the RIE method so that the upper surface of the stacked insulating film 5 on the insulator 4 is exposed. At this moment, the upper part of the isolation insulating film 10 is covered by the conducting layer 61.

Although the conducting layer 61 over the stacked insulating film 5 is removed by the RIE method here, this is not a limitation. For example, the conducting layer 61 may be removed by the CMP method using the upper surface of the stacked insulating film 5 as a stopper to expose the upper surface of the stacked insulating film 5.

As shown in FIGS. 9 and 10, the stack insulating film 5 on the insulator 4 is selectively removed by, for example, the RIE method, so that the upper surface of the insulator 4 is exposed. This provides, in a subsequent step, a structure in which the insulating film 5 as the inter-electrode insulating film is disconnected on the insulator 4, that is, a structure in which a slit 49 is formed in the insulating film 5 on the insulator 4.

Then, in a select transistor formation area, an opening Q is formed in the insulator 4, and the upper surface of the conducting layer 3 is exposed.

Furthermore, a third conducting layer 62 is formed on the insulator 4 whose upper surface is exposed and on the conducting layer 61 by, for example, the CVD method. For example, polysilicon is used for the third conducting layer 62. In the select transistor formation area, the third conducting layer 62 is in contact with the conducting layer 3 through the opening Q.

Subsequently, as shown in FIGS. 2 and 3, memory cells MC and select transistors SGD, SGS are patterned into the respective predetermined gate sizes (gate lengths) by the photolithographic technique. On the basis of this pattern, the conducting layer and the insulator are sequentially etched by, for example, the RIE method.

Thus, a floating gate electrode 3A and a control gate electrode 6A of the memory cell MC are formed on a tunnel insulating film 2A on the surface of the semiconductor substrate 1.

In the present embodiment, an insulator 4A is formed on the floating gate electrode 3A, and the insulator 4A is interposed between the floating gate electrode 3A and the control gate electrode 6A. Moreover, the inter-electrode insulating film 5A of a stacked structure is formed on the side surface of the floating gate electrode 3A in the x-direction. Via this inter-electrode insulating film 5A, the control gate electrode 6A covers the side surface of the floating gate electrode 3A in the x-direction.

Simultaneously with the gate electrodes 3A, 6A of the memory cell MC, gate electrodes 3B, 6B of the select transistors SGD, SGS are formed on a gate insulating film 2B on the surface of the semiconductor substrate 1. In the select transistors SGD, SGS, the upper gate electrode 6B is in contact with the lower gate electrode 3B on the gate insulating film 2B through the opening Q.

Furthermore, using the gate electrodes 3A, 3B, 6A, 6B as masks, source/drain diffusion layers 7A, 7D, 7S are formed in the semiconductor substrate 1 in a self-aligning manner. Thus, the memory cells MC and the select transistors SGD, SGS are formed in the memory cell array.

After the source/drain diffusion layers 7A, 7D, 7S have been formed, an insulating film covering the gate electrodes 3A, 3B, 6A, 6B is formed on the semiconductor substrate 1. This insulating film is then etched so that the upper surfaces of the control gate electrode 6A and the upper gate electrode 6B are exposed. Further, for example, a metal layer (nickel [Ni] film) is deposited on the control gate electrode 6A and the upper gate electrode 6B that are exposed, and the control gate electrode 6A and the upper gate electrode 6B are silicidated. Because of this silicidation, metal atoms (e.g., Ni atoms) are thermally diffused into the control gate electrode 6A and the upper gate electrode 6B, so that the control gate electrode 6A and the upper gate electrode 6B change from polysilicon layers to silicide layers. In addition, the entire conducting layer 6 may be silicidated so that the conducting layer may be one silicide layer, or the upper part of the conducting layer 6 alone may be silicidated to form a polycide structure.

After the silicidation, an insulating film is again deposited by the CVD method over the upper surfaces of the control gate electrode 6A and the upper gate electrode 6B that are exposed, so that a first interlayer insulating layer 15 is formed.

After planarization of the interlayer insulating layer 15, source line/bit line contacts SC, BC are embedded in the insulating layer 15 to be in direct contact with the diffusion layers 7D, 7S in a contact formation area.

Furthermore, the source line SL and a metal interconnect M0 are formed on the insulating layer 15 to be electrically connected to the source line/bit line contacts SC, BC, respectively.

A second interlayer insulating layer 16 is formed on the insulating layer 15 by, for example, the CVD method to cover the source line SL and the metal interconnect M0.

After a via contact VC to be connected to the interconnect M0 has been embedded in the interlayer insulating layer 16, a bit line BL is formed on the interlayer insulating layer 16 to be connected to the via contact VC.

The flash memory according to the embodiment of the present invention is completed by the manufacturing process described above.

In the present embodiment, the insulator 4A is formed on the floating gate electrode 3A, so that the memory cell MC has a structure in which the insulator 4A is interposed between the floating gate electrode 3A and the control gate electrode 6A. The thickness T1 of the insulator 4A is greater than the thickness T2 of the inter-electrode insulating film 5A.

In the manufacturing method of the present embodiment, the insulator 4A is formed on the floating gate electrode 3A, so that a memory cell is produced in which the coupling capacitance produced between the upper part of the floating gate electrode 3A and the control gate electrode 6A opposite thereto is low.

Furthermore, in the manufacturing method of the present embodiment, the slit 49 is formed in the inter-electrode insulating film 5A including the insulating film 51 on the insulator 4A. As a result, the insulating film 51 is removed from the upper side of the floating gate electrode 3A. Thus, especially when a high-dielectric film is included the inter-electrode insulating film 5A, there is no production of coupling capacitance in the upper part of the floating gate electrode 3A due to the insulating film 51.

Thus, in the memory cell MC formed by the manufacturing method of the present embodiment, concentration of an electric field in the upper part of the floating gate electrode 3A can be inhibited even when the curvature radius of the upper part of the floating gate electrode 3A is decreased. As a result, a high-intensity electric field is not applied across the floating gate electrode 3A and the control gate electrode 6B. Therefore, according to the manufacturing method of the present embodiment, it is possible to form a memory cell whose current leakage does not degrade despite the shrinking of the memory cell.

Moreover, as shown in FIGS. 5 and 6, the insulator 4 is formed on the conducting layer 3 as the floating gate electrode, and this insulator 4 is used as a mask layer for forming the isolation insulating film 10. In this case, the insulator 4 is left on the conducting layer 3 to reduce the coupling capacitance of the memory cell, and there is therefore no step of removing the mask layer from the upper surface of the conducting layer 3. This enables to prevent the shape of the upper part of the conducting layer 3 (floating gate electrode) from being varied by the removing of the mask layer. Moreover, as described above, the coupling capacitance in the upper part of the floating gate electrode 3A is lower in the memory cell MC formed by the manufacturing method of the present embodiment.

Therefore, in the memory cell MC formed by the manufacturing method of the present embodiment, it is possible to reduce the variation of coupling capacitance due to the variation of the shape of the upper part of the floating gate electrode 3A.

As described above, according to the method of manufacturing the nonvolatile semiconductor memory (flash memory) in the first embodiment of the present invention, it is possible to provide a flash memory in which degradation of the characteristics of the memory cell due to the shrink is inhibited. Moreover, according to the manufacturing method in the present embodiment, it is possible to provide a flash memory in which variation of the characteristics is inhibited.

(c) Second Manufacturing Method

Now, another manufacturing method is described with FIGS. 11 and 12. This manufacturing method is different from the example of the manufacturing method of the nonvolatile semiconductor memory (flash memory) according to the first embodiment which has been described with FIGS. 2 to 10. In addition, steps similar to those in the manufacturing method previously described are not described in detail.

The flash memory manufacturing method described here is different from the previously described first manufacturing method in the step of forming a trench U for the formation of an isolation insulating film 10.

As in the example shown in FIGS. 5 and 6, a conducting layer 3 and an insulator 4 are sequentially formed on a semiconductor substrate 1. Further, as shown in FIGS. 11 and 12, a mask layer 40 is formed on the insulator 4 by, for example, the CVD. In addition, in order to ensure etching selectivity between the insulator 4 and the mask layer 40, different materials are preferably used for the insulator 4 and the mask layer 40. For example, the insulator 4 is formed by a silicon oxide film, and the mask layer 40 is formed by a silicon nitride film.

Furthermore, the mask layer 40 is patterned by the photolithographic technique. On the basis of a formed pattern, the insulator 4, the conducting layer 3, an insulating film 2 and the semiconductor substrate 1 are sequentially etched by, for example, the RIE method, and a trench U extending in the y-direction is formed in the semiconductor substrate 1. An isolation insulating film 10 is embedded in this trench U, so that an isolation separation area STI and element areas AA partitioned by the area STI are formed.

Then, the upper surface of the isolation insulating film 10 is planarized by the CMP method to coincide with the upper surface of the mask layer 40. After the planarization, the upper surface of the isolation insulating film 10 is etched back by, for example, the RIE method. Thus, the upper surface of the isolation insulating film 10 is set back closer to the semiconductor substrate 1 than the upper surface of the first conducting layer 3 as the floating gate electrode, and the side surface of the conducting layer 3 in the x-direction is exposed. Subsequently, for example, the mask layer 40 is removed.

When the mask layer 40 is removed, an insulating film 5 as an inter-electrode insulating film is formed on the insulator 4 and on the isolation insulating film 10. Further, the memory cell shown in FIGS. 2 and 3 is formed by steps similar to those shown in FIGS. 7 to 10, and the flash memory according to the present embodiment is completed.

In addition, the mask layer 40 may be left on the insulator 4 without being removed. In this case, as shown in FIG. 13, insulators 4A, 4B provided on the upper surface of the floating gate electrode 3A form a stacked structure. For example, a silicon nitride film is used for the upper insulator 4B, and a silicon oxide film is used for the lower insulator 4A. In this case, the insulator 4 and the mask layer 40 are formed in the step shown in FIGS. 11 and 12 so that the thickness T1' of a stack composed of the upper insulator 4B and the lower insulator 4A is changed from 40 to 60 nm after the formation of the memory cell.

As described above, since the upper insulator 4B serves as a mask when the trench U is formed, the upper insulator 4B is subjected to fabrication damage (e.g., sputtering) attributed to the RIE method due to charge traps contained in the mask layer (silicon nitride), which leads to a decrease in a breakdown voltage. In order to compensate for this, the silicon oxide film with fewer charge traps can be used for the lower insulator 4A to improve the breakdown voltage across the floating gate electrode 3A and the control gate electrode 6A. In addition, these materials are not exclusively used for the insulators 4A, 4B, and other insulating materials may be used.

As described above, according to the second manufacturing method using FIGS. 11 and 12, the lower insulator 4A is formed between the conducting layer 3 as the floating gate electrode and the mask layer 40, so that there is no step of directly removing the mask layer 40 from the upper surface of the conducting layer 3. Moreover, in the structure of the memory cell shown in FIG. 13, there is no need for the step of removing the mask layer 40. Therefore, it is possible to inhibit the variation of the shape of the upper part of the conducting layer 3 (floating gate electrode 3A) due to the detachment of the mask layer 40.

Similarly to the memory cell formed in the first manufacturing method, the memory cell MC formed by the second manufacturing method in the present embodiment has the insulators 4A, 4B provided on the floating gate electrode 3A, so that the coupling capacitance produced in the upper part of the floating gate electrode 3A is reduced. Moreover, it is possible to inhibit the application of an electric field of excessive intensity to the upper part of the floating gate electrode 3A.

Thus, in the memory cell MC formed by the second manufacturing method in the present embodiment, degradation of leakage characteristics of the memory cell or variation of coupling capacitance is not easily caused by the variation of the shape of the upper part of the floating gate electrode 3A.

Consequently, when the nonvolatile semiconductor memory (flash memory) according to the first embodiment of the present invention is manufactured by the second manufacturing method, it is also possible to provide a flash memory in which degradation of the element characteristics of the memory cell due to the shrink is inhibited. Moreover, it is possible to provide a flash memory in which variation of the characteristics is inhibited.

(2) Second Embodiment

The second embodiment of the present invention is described with FIGS. 14 and 15. It should be noted that the same components as the elements described in the first embodiment are provided with the same signs and are described in detail when needed.

(a) Structure

The structure of a nonvolatile semiconductor memory according to the second embodiment of the present invention is described with FIG. 14. It should be noted that, in the present embodiment, the sectional structure of a memory cell MC in the y-direction (channel length direction) is similar to that shown in FIG. 2 and is therefore not described here.

FIG. 14 shows the sectional structure of the memory cell MC in the x-direction in the flash memory according to the present embodiment.

As shown in FIG. 14, an insulator 4A is provided on a floating gate electrode 3A. The thickness T1 of the insulator 4A is greater than the thickness T2 of an inter-electrode insulating film 5A. Owing to this insulator 4A, the coupling capacitance produced between the upper part of the floating gate electrode 3A and the control gate electrode 6A opposite thereto is significantly reduced. This makes it possible to inhibit the degradation of the current leakage of the memory cell and the variation of coupling capacitance due to the shape of the upper part of the floating gate electrode 3A.

As shown in FIG. 14, the memory cell MC described in the second embodiment is different from the memory cell in the first embodiment in that the inter-electrode insulating film 5A has a slit (second slit) 48 on an isolation insulating film 10. The slit 48 is thus provided in the inter-electrode insulating film 5A on the isolation insulating film 10, such that the inter-electrode insulating film 5A is disconnected on the isolation insulating film 10. In this structure, the inter-electrode insulating film 5A is not shared by the memory cells adjacent in the x-direction, and the inter-electrode insulating film 5A is independently provided for each of the memory cells MC.

Thus, there is no movement of a charge in the inter-electrode insulating film 5A, in particular, from a certain memory cell to an adjacent memory cell along the interface of stacked insulating films 50, 51, 52. As a result, in the memory cell MC of the present embodiment, variation of the threshold voltage of the memory cells due to the movement of the charge in the inter-electrode insulating film 5A is reduced. This makes it possible to prevent the degradation of the data retention characteristics of the memory cell.

Furthermore, in the present embodiment, inter-electrode insulating film 5A having a high dielectric constant on the isolation insulating film 10 is not provided, so that parasitic capacitance resulting from the inter-electrode insulating film 5A on the isolation insulating film 10 is reduced. Therefore, mutual interference between the memory cells caused by the parasitic capacitance is inhibited.

Moreover, in the present embodiment, the control gate electrode 6A is in direct contact with the upper surface of the isolation insulating film 10, and the whole area between two memory cells MC adjacent in the x-direction is filled with a conducting material. The conducting material (e.g., polysilicon or silicide) used for the control gate electrode 6A has a shielding effect. That is, the control gate electrode 6A functions as a shielding member for the floating gate electrodes 3A of the memory cells adjacent in the x-direction. The mutual interference between adjacent memory cells can be further reduced by the shielding effect of the control gate electrode 6A.

Consequently, according to the nonvolatile semiconductor memory (flash memory) in the second embodiment of the present invention, degradation of the element characteristics of the memory cell due to the shrink can be inhibited, as in the first embodiment.

(b) Manufacturing Method

A method of manufacturing the nonvolatile semiconductor memory (flash memory) according to the second embodiment of the present invention is described with FIGS. 14 and 15. In the manufacturing method of the present embodiment, the manufacturing process in the section of a memory cell along the x-direction is shown. Moreover, steps similar to those in the manufacturing process described in the first embodiment are not described in detail.

First, by a step similar to that shown in FIGS. 5 and 6, a first conducting layer 3 serving as a floating gate electrode of the memory cell and an insulator 4 are sequentially formed on an insulating film 2 which is formed on the surface of a semiconductor substrate 1. In addition, the insulator 4 is formed so that it is thicker than a stacked insulating film (inter-electrode insulating film) to be formed in a subsequent step.

Furthermore, a trench U is formed in the semiconductor substrate 1 by the photolithographic technique and the RIE method, and then an isolation insulating film 10 is embedded in the trench U. The upper surface of the isolation insulating film 10 is etched back and thus set back closer to the semiconductor substrate 1 than the upper end of the conducting layer 3.

As shown in FIG. 15, a stacked insulating film 5 as an inter-electrode insulating film is formed on the insulator 4, on the isolation insulating film 10 and on the side surface of the conducting layer 3. Further, the formed inter-electrode insulating film 5 is etched by the anisotropic RIE method. The stacked insulating film 5 is removed from the upper surface of the insulator 4 and from the upper surface of the isolation insulating film 10. That is, a slit 48 is formed in the stacked insulating film 5 on the isolation insulating film 10. On the other hand, the stacked insulating film 5 remains on the side surface of the conducting layer 3.

As a result, the stacked insulating film 5 as the inter-electrode insulating film has the slit 48, 49 on the upper surface of the insulator 4 and on the upper surface of the isolation insulating film 10, and the stacked insulating film 5 is only provided on the side surface of the conducting layer 3 as the floating gate electrode along the x-direction.

As shown in FIG. 14, a conducting layer 6A as a control gate electrode is formed on the insulator 4A, the isolation insulating film 10 and the stacked insulating film 5A by, for example, the CVD method. As described above, the stacked insulating film (inter-electrode insulating film) 5A is removed from the upper surface of the insulator 4 and from the upper surface of the isolation insulating film, so that the conducting layer 6A is in direct contact with the upper surface of the insulator 4 and the upper surface of the isolation insulating film 10.

After the conducting layer 6A has been formed, gate fabrication is performed by a step similar to that shown in FIGS. 2 and 3 to form a control gate electrode 6A and a floating gate electrode 3A of a memory cell MC. At the same time, gate electrodes 3B, 6B of select transistors SGD, SGS are formed. Further, using the formed gate electrodes 3A, 6A, 3B, 6B as masks, source/drain diffusion layers 7A, 7D, 7S are formed in the semiconductor substrate 1 in a self-aligning manner.

After the control gate electrode 6A is silicidated, interlayer insulating layers 15, 16, contacts SC, BC and source line/bit line SL, BL are sequentially formed.

The flash memory according to the second embodiment is completed by the process described above.

In the manufacturing method in the second embodiment of the present invention, the insulator 4A is formed on the floating gate electrode 3A, as in the first embodiment. The thickness T1 of the insulator 4A is greater than the thickness T2 of the inter-electrode insulating film 5A.

Thus, in the manufacturing method of the present embodiment as well, the insulator 4A is formed on the floating gate electrode 3A, so that a memory cell is produced in which the coupling capacitance produced between the upper part of the floating gate electrode 3A and the control gate electrode 6A opposite thereto is low. This makes it possible to inhibit the degradation of the current leakage attributed to the concentration of an electric field in the upper part of the floating gate electrode 3A and the variation of coupling capacitance of the memory cell due to the shape variation of the upper part of the floating gate electrode 3A.

Furthermore, in the manufacturing method described in the present embodiment, the slit 48 is formed in the inter-electrode insulating film 5A provided on the isolation insulating film 10, so that the inter-electrode insulating film 5A is disconnected on the isolation insulating film 10.

Thus, the movement of a charge in the inter-electrode insulating film 5A, in particular, from a certain memory cell to an adjacent memory cell along the interface of the stacked insulating films 50, 51, 52 forming the inter-electrode insulating film 5A is reduced. This makes it possible to prevent the degradation of the data retention characteristics of the memory cell due to the movement of the charge in the inter-electrode insulating film 5A.

In the manufacturing method in the embodiment of the present invention, the slit 48 is formed in the inter-electrode insulating film 5A on the isolation insulating film 10, so that the inter-electrode insulating film 5A is removed from the upper part of the isolation insulating film 10. Thus, parasitic capacitance resulting from the inter-electrode insulating film 5A on the isolation insulating film 10 is reduced. Moreover, because of the removal of the inter-electrode insulating film 5A on the isolation insulating film 10, the whole area between two memory cells MC adjacent in the x-direction is filled with the control gate electrode 6A having a shielding effect. Thus, the mutual interference between adjacent memory cells can be inhibited.

Consequently, according to the method of manufacturing the nonvolatile semiconductor memory (flash memory) in the second embodiment of the present invention, it is possible to provide a nonvolatile semiconductor memory in which degradation of the element characteristics of the memory cell due to the miniaturization is inhibited, as in the first embodiment.

(3) Third Embodiment

The structure and manufacturing method of a nonvolatile semiconductor memory (flash memory) according to the third embodiment of the present invention are described with reference to FIGS. 16 and 17. It should be noted that the same components as the components in the first and second embodiments are provided with the same signs and are described in detail when needed.

(a) Structure

The structure of the flash memory according to the third embodiment is described with FIG. 16. It should be noted that, in the present embodiment, the sectional structure of a memory cell MC in the y-direction (channel length direction) is similar to that shown in FIG. 2 and is therefore not described here.

FIG. 16 shows the sectional structure of the memory cell MC in the x-direction in the flash memory according to the present embodiment.

In the present embodiment, an inter-electrode insulating film 5A is provided with a slit 48, 49 on the upper surface of an insulator 4A and on the upper surface of an isolation insulating film 10, and the inter-electrode insulating film 5A is disconnected on the insulator 4A and on the isolation insulating film 10, as in the second embodiment. In the present embodiment as well, the thickness T1 of the insulator 4A is greater than the thickness T2 of the inter-electrode insulating film 5A.

The memory cell MC in the present embodiment is different from the memory cell in the second embodiment in that a second insulator 12A is provided in the slit 48 formed on the isolation insulating film 10. That is, the second insulator 12A is interposed between a control gate electrode 6A and the isolation insulating film 10.

The dielectric constant of the insulator 12A is lower than the dielectric constant of the inter-electrode insulating film 5A. More specifically, the dielectric constant of the insulator 12A is lower than that of an insulating film 51 included in the inter-electrode insulating film 5A. For example, a silicon oxide or low-dielectric-constant film (low-k) is used for the insulator 12A. In addition, a material of the insulator 12A is preferably different from that of the first insulator 4A.

The control gate electrode 6A covers the side surface of the floating gate electrode 3A via the inter-electrode insulating film 5A to ensure the coupling capacitance between the side surface of the floating gate electrode 3A in the x-direction and the control gate electrode 6A.

In the present embodiment as well, the insulator 4A having sufficient thickness is provided on the floating gate electrode 3A, so that the coupling capacitance produced between the upper part of the floating gate electrode 3A and the control gate electrode 6A is reduced. Thus, as in the first and second embodiments, degradation of the current leakage of the memory cell and variation of coupling capacitance are not easily caused by the shape of the upper part of the floating gate electrode 3A.

As described above, in the present embodiment, the inter-electrode insulating film 5A is not shared between the memory cells MC adjacent in the x-direction, and electrically separated by the insulator 12A. Thus, the variation of the threshold voltage of the memory cells due to the movement of the charge in the inter-electrode insulating film 5A is reduced. As a result, in the memory cell of the present embodiment, degradation of the data retention characteristics of the memory cell can be prevented.

Furthermore, in the present embodiment, the inter-electrode insulating film 5A is removed from the upper part of the isolation insulating film 10, and the insulator 12A lower in dielectric constant than the insulating film 51 is provided on the isolation insulating film 10. Thus, the parasitic capacitance resulting from the inter-electrode insulating film 5A on the isolation insulating film 10 is small, and mutual interference between adjacent memory cells can be reduced. This is particularly advantageous when a high-dielectric film is used for the insulating film 51.

Consequently, in the nonvolatile semiconductor memory according to the third embodiment of the present invention, degradation of the element characteristics of the memory cell due to the miniaturization can be inhibited as in the first and second embodiments.

(b) Manufacturing Method

A method of manufacturing the nonvolatile semiconductor memory (flash memory) according to the third embodiment of the present invention is described with FIGS. 16 and 17. In the manufacturing method of the present embodiment, the manufacturing process in the section of a memory cell along the x-direction only is shown. Moreover, steps similar to those in the manufacturing process described in the first and second embodiments are not described in detail.

By a step similar to that shown in FIG. 15, a stacked insulating film 5 is formed on the side surface of a first conducting layer 3, on an insulator 4 and on an isolation insulating film 10, as shown in FIG. 17. Further, the stacked insulating film 5 formed on the insulator 4 and on the isolation insulating film 10 are etched by, for example, the anisotropic RIE method. That is, slit 48, 49 is formed in the stacked insulating film 5 on the insulator 4 and on the isolation insulating film 10. In this case, the stacked insulating film 5 remains on the side surface of the conducting layer 3 in the x-direction.

Then, a second insulator 12 is formed on the insulator 4 and on the isolation insulating film 10 by, for example, the CVD method. This insulator 12 is embedded in an area between the conducting layers 3 adjacent in the x-direction. The dielectric constant of the insulator 12 is lower than the dielectric constant of an insulating film 51 (silicon nitride film or high-dielectric film) forming the stacked insulating film 5.

As described above, the stacked insulating film 5 is removed from the upper part of the isolation insulating film 10, so that the insulator 12 is formed to be in direct contact with the upper surface of the isolation insulating film 10.

Then, the formed insulator 12 is selectively etched back by, for example, the RIE method or wet etching. This etch-back is carried out so that the insulator 12 remains on the isolation insulating film 10. As a result, an insulator 12A is formed on the isolation insulating film 10, as shown in FIG. 16.

When the insulator 12 is selectively removed by the etch-back as shown in FIGS. 16 and 17, different materials are preferably used for the insulator 4A and the insulator 12A to ensure sufficient etching selectivity so that the insulator 4A is not etched under the same condition. However, the present invention is not limited to this approach. For example, the insulating film 12 may be removed by the RIE or CMP method to expose the surface of the insulator 4A, and then the exposed insulator 4 alone may be covered with a resist, and the insulator 12 on the isolation insulating film 10 may be etched. In addition, the insulator 12 may remain on the insulator 4.

After the insulator 12A has been formed, a conducting layer 6A as a control gate electrode is formed on an inter-electrode insulating film 5A and on the insulators 4A, 12A by the CVD method, in a step similar to that shown in FIGS. 2 and 3.

Then, the conducting layer and the insulator are subjected to gate fabrication, so that the control gate electrode 6A and the floating gate electrode 3A of the memory cell MC are formed. At the same time, gate electrodes 3B, 6B of select transistors SGD, SGS are formed.

Using the formed gate electrodes 3A, 3B, 6A, 6B as masks, source/drain diffusion layers 7A, 7D, 7S are formed in the semiconductor substrate 1 in a self-aligning manner.

After the control gate electrode is silicidated, interlayer insulating layers 15, 16, contacts SC, BC and source line/bit line SL, BL are sequentially formed.

The flash memory according to the third embodiment is completed by the process described above.

In the manufacturing method in the third embodiment of the present embodiment, the insulator 4A is formed on the floating gate electrode 3A, so that a memory cell is produced in which the coupling capacitance produced between the upper part of the floating gate electrode 3A and the control gate electrode 6A is low, as in the first embodiment. This makes it possible to inhibit the degradation of the current leakage of the memory cell MC or the variation of coupling capacitance of the memory cell due to the shape of the upper part of the floating gate electrode 3A.

Furthermore, in the manufacturing method of the present embodiment, the slit 48 is formed in the inter-electrode insulating film 5A on the isolation insulating film 10 such that the inter-electrode insulating film 5A is removed from the upper part of the isolation insulating film 10, as in the second embodiment. Thus, the movement of a charge in the inter-electrode insulating film 5A, in particular, from a certain memory cell to an adjacent memory cell along the interface of the stacked insulating films 50, 51, 52 included in the inter-electrode insulating film 5A is reduced. This makes it possible to prevent the degradation of the data retention characteristics of the memory cell.

Moreover, in the manufacturing method described in the present embodiment, the insulator 12A is formed on the isolation insulating film 10 where the inter-electrode insulating film has been removed. The dielectric constant of the insulator 12A is lower than the dielectric constant of the insulating film 51 included in the inter-electrode insulating film 5A. Thus, parasitic capacitance resulting from the inter-electrode insulating film 5A on the isolation insulating film 10 is reduced. As a result, mutual interference between adjacent memory cells can be inhibited in the present embodiment.

Consequently, according to the method of manufacturing the nonvolatile semiconductor memory (flash memory) in the third embodiment of the present invention, it is possible to provide a nonvolatile semiconductor memory in which degradation of the element characteristics of the memory cell due to the shrink is inhibited, as in the first and second embodiments.

(4) Fourth Embodiment

The structure and manufacturing method of a nonvolatile semiconductor memory (flash memory) according to the fourth embodiment of the present invention are described with reference to FIGS. 18 and 19. It should be noted that the same components as the components in the first to third embodiments are provided with the same signs and are described in detail when needed.

(a) Structure

The structure of the flash memory according to the fourth embodiment of the present invention is described with FIG. 18. It should be noted that, in the present embodiment, the sectional structure of a memory cell MC in the y-direction (channel length direction) is similar to that shown in FIG. 2 and is therefore not described here.

FIG. 18 shows the sectional structure of the memory cell MC in the x-direction in the flash memory according to the present embodiment.

As shown in FIG. 18, in the memory cell MC of the present embodiment, an insulator 4A is provided on a floating gate electrode 3A, as in the first embodiment. The thickness T1 of the insulator 4A is greater than the thickness T2 of an inter-electrode insulating film 5A. Thus, the coupling capacitance produced between the upper part of the floating gate electrode 3A and the control gate electrode 6A is reduced. Thus, in the present embodiment as well, degradation of the current leakage of the memory cell MC and variation of coupling capacitance of the memory cell are not easily caused by the shape of the upper part of the floating gate electrode 3A.

Furthermore, in the memory cell MC of the present embodiment, the inter-electrode insulating film 5A has a slit 48, 49 on the insulator 4A and on an isolation insulating film 10, and the inter-electrode insulating film 5A is disconnected on the upper surface of the insulator 4A and on the upper surface of the isolation insulating film 10, as in the second and third embodiments. Thus, the movement of a charge from a certain memory cell to an adjacent memory cell along the interface in the inter-electrode insulating film 5A is reduced. This makes it possible to prevent the degradation of the data retention characteristics of the memory cell MC.

Moreover, the present embodiment is different from the first to third embodiments in that an air gap AG is provided on the isolation insulating film 10. That is, in the memory cell MC of the present embodiment, the space between the control gate electrode 6A and the isolation insulating film 10 is filled with air (or a vacuum). In addition, the control gate electrode 6A covers the side surface of the floating gate electrode 3A via the inter-electrode insulating film 5A to ensure the coupling capacitance between the side surface of the floating gate electrode 3A in the x-direction and the control gate electrode 6A.

In the present embodiment, the provision of the air gap AG makes it possible to inhibit electric interaction produced between adjacent memory cells MC. In particular, the dielectric constant of the air gap AG, that is, the dielectric constant of air is lower than the dielectric constant of the insulator 12A in the third embodiment. Therefore, parasitic capacitance between adjacent memory cells is lower than when a shielding member or an insulator is provided between two memory cells MC.

As a result, mutual interference between the memory cells MC can be inhibited in the present embodiment than in the second and third embodiments.

Consequently, according to the nonvolatile semiconductor memory in the fourth embodiment of the present invention, degradation of the element characteristics of the memory cell due to the shrink can be inhibited, as in the first to third embodiments.

(b) Manufacturing Method

Figure 19:
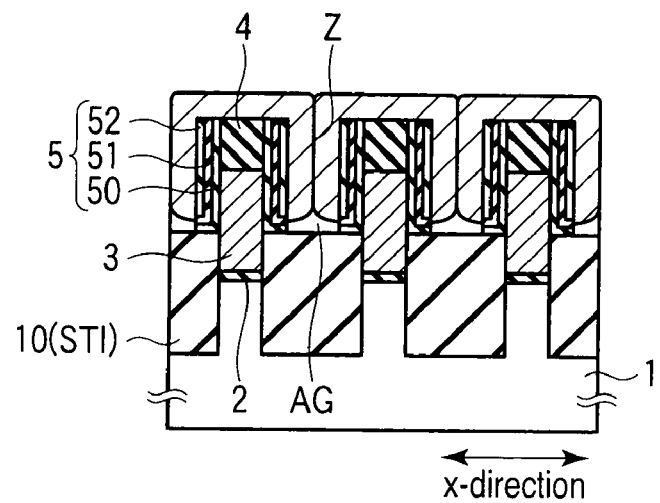
FIG. 19 is a sectional view for explaining one step of a manufacturing method according to the fourth embodiment.

A method of manufacturing the nonvolatile semiconductor memory (flash memory) according to the fourth embodiment of the present invention is described with FIGS. 18 and 19. In the manufacturing method of the present embodiment, the manufacturing process in the section of a memory cell along the x-direction only is shown. Moreover, steps similar to those in the manufacturing process described in the first to third embodiments are not described in detail.

By a step similar to that shown in FIG. 15, a stacked insulating film 5 as an inter-electrode insulating film is removed from the upper part of an insulator 4 and the upper part of the isolation insulating film 10, for example, by the RIE method, as shown in FIG. 19.

Then, a conducting layer 63 as a control gate electrode is formed on a semiconductor substrate 1, for example, by the CVD method.

Here, in the present embodiment, for example, the distance between adjacent memory cells is smaller than the thickness of a conducting film 3 and the insulator 4, so that the aspect ratio which is the ratio of the thickness to the distance is high. In this case, the conducting layer 63 is only deposited on upper side surface of the stacked insulating film 5 and not deposited on the isolation insulating film 10. The reason is that in the upper part of the stacked insulating film 5, the conducting layers 63 deposited on the side surface of the stacked insulating film 5 contact each other before the conducting layers 63 are deposited on the isolation insulating film 10. So that, an opening in the upper part of the isolation insulating film 10 is blocked by the conducting layers 63. As a result, an air gap AG is formed on the isolation insulating film 10. In addition, in order to ensure the coupling capacitance of the memory cell to be formed, the conducting layer 63 formed on the side surface of the stacked insulating film 5 is deposited to cover the side surface of the conducting layer 3 in the x-direction via the stacked insulating film 5.

Then, by a step similar to that shown in FIGS. 2 and 3, the conducting layer and the insulator are subjected to gate fabrication, so that the control gate electrode 6A and the floating gate electrode 3A of the memory cell MC are formed. At the same time, gate electrodes 3B, 6B of select transistors SGD, SGS are formed.

Then, using the formed gate electrodes 3A, 3B, 6A, 6B as masks, source/drain diffusion layers 7A, 7D, 7S are formed in the semiconductor substrate 1 in a self-aligning manner. Further, the control gate electrode 6A is silicidated. Owing to the diffusion of metal atoms and the recrystallization of the conducting layer resulting from the silicidation (thermal treatment), a joint surface (seam) Z between the conducting layers 63 shown in FIG. 19 disappear.

Subsequently, interlayer insulating layers 15, 16, contacts SC, BC and source line/bit line SL, BL are sequentially formed.

The flash memory according to the present embodiment is completed by the manufacturing process described above.

In the manufacturing method in the fourth embodiment of the present embodiment, the insulator 4A is formed on the floating gate electrode 3A, so that a memory cell is produced in which the coupling capacitance produced between the upper part of the floating gate electrode 3A and the control gate electrode 6A is low. Thus, in the memory cell MC of the of the present embodiment, the degradation of the current leakage of the memory cell and the variation of coupling capacitance due to the shape of the upper part of the floating gate electrode 3A can be inhibited.

Furthermore, in the manufacturing method described in the present embodiment, a slit 48 is formed in the inter-electrode insulating film 5A on the isolation insulating film 10, so that the inter-electrode insulating film 5A is removed from the upper part of the isolation insulating film 10, as in the second and third embodiments. Thus, the movement of a charge in the inter-electrode insulating film 5A from a certain memory cell to an adjacent memory cell along the interface of the stacked insulating films 50, 51, 52 included in the inter-electrode insulating film 5A is reduced. This makes it possible to inhibit the degradation of the data retention characteristics of the memory cell due to the movement of the charge.

Moreover, in the manufacturing method of the present embodiment, the air gap AG is formed on the isolation insulating film 10. The dielectric constant of the air gap is lower than the dielectric constant of the insulating film 51 (silicon nitride or high-dielectric film) included in the inter-electrode insulating film 5A. Thus, parasitic capacitance resulting from the inter-electrode insulating film 5A on the isolation insulating film 10 is reduced. As a result, mutual interference between adjacent memory cells can be inhibited.

Consequently, according to the method of manufacturing the nonvolatile semiconductor memory (flash memory) in the fourth embodiment of the present invention, it is possible to provide a nonvolatile semiconductor memory in which degradation of the element characteristics of the memory cell due to the miniaturization is inhibited, as in the first to third embodiments.

(5) Modification

A modification of the nonvolatile semiconductor memory (flash memory) according to the first to fourth embodiments of the present invention is described with reference to FIGS. 20 to 24. It should be noted that the same components as the components in the first to fourth embodiments are provided with the same signs and are described in detail when needed.

As described above, the data retention characteristics are degraded by the movement of a charge from a certain memory cell to an adjacent memory cell along the interface between the insulating film 51 and the insulating films 50, 52 forming the inter-electrode insulating film 5A. Moreover, mutual interference between adjacent memory cells is mainly caused by the insulating film 51 having a high dielectric constant.

In the second to fourth embodiments, in order to inhibit such phenomena, the slit is provided in the inter-electrode insulating film 5A on the isolation insulating film 10, such that the inter-electrode insulating film 5A is removed from the upper part of the isolation insulating film 10.

However, if the inter-electrode insulating film 5A does not contain any interface on the isolation insulating film 10, degradation of the data retention characteristics can be inhibited. In addition, if the inter-electrode insulating film 5A does not include insulating film 51 having a high dielectric constant on the isolation insulating film 10, mutual interference between adjacent memory cells MC is can be reduced.

Figure 20:
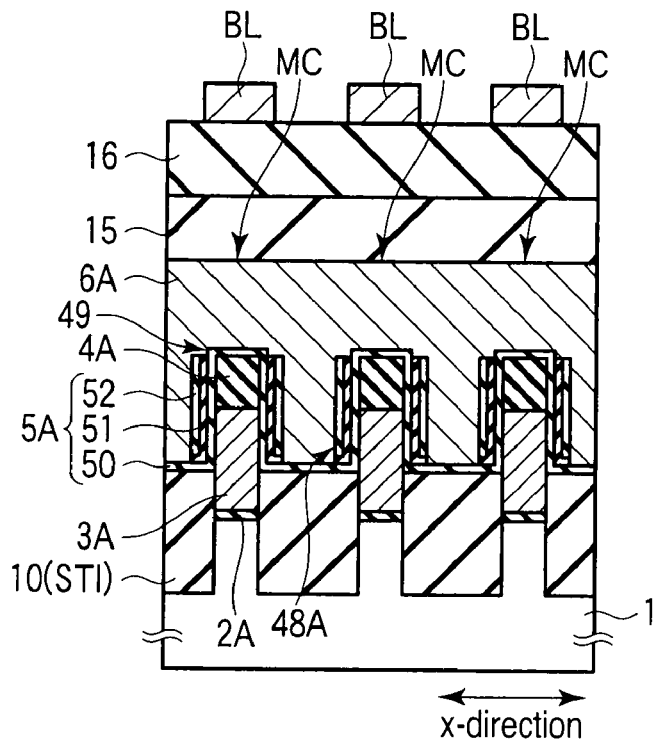
FIG. 20 is a sectional view for explaining a modification.

That is, as shown in FIG. 20, if the insulating film 51 is removed from the upper part of the isolation insulating film 10, the lowermost insulating film (e.g., a silicon oxide film) 50 included in the inter-electrode insulating film 5A of the stacked structure may remain on the isolation insulating film 10. In this case as well, the inter-electrode insulating film 5A does not include interface resulting from the stack structure on the isolation insulating film 10. Thus, in this modification as well, the movement of the charge can be prevented.

Furthermore, as described above, a silicon oxide film, for example, is used for the insulating film 50, and its dielectric constant is low. Therefore, even if the insulating film 50 remains on the isolation insulating film 10, there is only a small influence on the mutual interference between adjacent memory cells MC. Thus, in the present modification as well, the mutual interference between adjacent memory cells MC can be inhibited.

Moreover, even if the inter-electrode insulating film 5A including the insulating film 51 is provided on the insulator 4A, the coupling capacitance produced between the upper part of the floating gate electrode 3A and the control gate electrode 6A is sufficiently low as long as the insulator 4A is sufficiently thick. Therefore, as shown in FIG. 21, if the inter-electrode insulating film 5A on the isolation insulating film 10 is removed, the inter-electrode insulating film 5A may be provided on the insulator 4A.

Still further, as shown in FIG. 22, the lowermost insulating film 50 of the inter-electrode insulating film 5A may remain on the insulator 4A.

Furthermore, as shown in FIG. 23, when insulators 4A, 4B on the upper part of the floating gate electrode have a multi-layer structure, a slit 48, 49 may be provided in the inter-electrode insulating film 5A on the insulator 4B and on the isolation insulating film. For example, silicon nitride is used for the upper insulator 4B, silicon oxide is used for the lower insulator 4A.

And also, as shown FIG. 24, when the insulator 4A on the upper part of the floating gate electrode has a trapezoidal (tapered) shape in which the upper surface is sized smaller than the bottom surface, slit 48, 49 may be provided in the interelectrode insulating film on the insulator 4A and on the isolation insulating film 10.

As described above, it is apparent that advantages similar to the advantages described in the first to fourth embodiments are obtained in the memory cell MC of the structure shown in FIGS. 20 to 24.

3. Additional Note

According to the embodiments of the present invention, deterioration of the element characteristics of the memory cell due to the shrink can be inhibited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
    an element area between two isolation insulating films adjacent in a first direction;
    two diffusion layers provided in the element area;
    a tunnel insulating film provided on the surface of the element area between the two diffusion layers;
    a charge storage layer provided on the tunnel insulating film;
    a first insulator provided on the upper surface of the charge storage layer;
    an inter-electrode insulating film provided on the first insulator, on the side surface of the charge storage layer in the first direction and on the isolation insulating film, and the inter-electrode insulating film having an uppermost point that is equal with an upper surface of the first insulator; and
    a control gate electrode which extends in the first direction and which covers the charge storage layer via the first insulator and the inter-electrode insulating film,
    wherein the first insulator is thicker than the inter-electrode insulating film, and
    the inter-electrode insulating film has a first slit on the first insulator.

2. The nonvolatile semiconductor memory according to claim 1, wherein
    the control gate electrode is in contact with the upper surface of the first insulator through the first slit.

3. The nonvolatile semiconductor memory according to claim 1, wherein
    the inter-electrode insulating film has a second slit on the isolation insulating film.

4. The nonvolatile semiconductor memory according to claim 3, wherein
    the control gate electrode is in contact with the isolation insulating film through the second slit.

5. The nonvolatile semiconductor memory according to claim 3, further comprising:
a second insulator which is provided in the second slit between the control gate electrode and the isolation insulating film and which is lower in dielectric constant than the inter-electrode insulating film.

6. The nonvolatile semiconductor memory according to claim 3, further comprising:
an air gap provided in the second slit between the control gate electrode and the isolation insulating film.

7. The nonvolatile semiconductor memory according to claim 3, wherein
the inter-electrode insulating film has a lowermost insulating film, an uppermost insulating film, and a middle insulating film between the lowermost insulating film and the uppermost insulating film,
a dielectric constant of the lowermost insulating film and the uppermost insulating film is less than or equal to that of the middle insulating films.

8. The nonvolatile semiconductor memory according to claim 7, wherein
the first slit is provided in the inter-electrode insulating film so that the lowermost insulating film remains.

9. The nonvolatile semiconductor memory according to claim 7, wherein
the second slit is provided in the inter-electrode insulating film so that the lowermost insulating film remains.

10. The nonvolatile semiconductor memory according to claim 1, wherein
the first insulator has a trapezoidal shape in which the upper surface is sized smaller than the bottom surface in the first direction.

11. The nonvolatile semiconductor memory according to claim 1, wherein
the first insulator has a multilayer structure including a plurality of insulating films.

12. The nonvolatile semiconductor memory according to claim 1, wherein
the inter-electrode insulating film has a multilayer structure including a plurality of insulating films.

13. The nonvolatile semiconductor memory according to claim 1, wherein a dielectric constant of the first insulator is less than or equal to that of the inter-electrode insulating film.

14. The nonvolatile semiconductor memory according to claim 1, wherein the inter-electrode insulating film is provided on the side surface of the first insulator in the first direction.

15. A nonvolatile semiconductor memory comprising:
an element area between two isolation insulating films adjacent in a first direction;
two diffusion layers provided in the element area;
a tunnel insulating film provided on the surface of the element area between the two diffusion layers;
a charge storage layer provided on the tunnel insulating film;
a first insulator provided on the upper surface of the charge storage layer;
an inter-electrode insulating film provided on the first insulator, on the side surface of the charge storage layer in the first direction and on the isolation insulating film, and the inter-electrode insulating film having an uppermost point that is equal with an upper surface of the first insulator; and
a control gate electrode which extends in the first direction and which covers the charge storage layer via the first insulator and the inter-electrode insulating film,
wherein the first insulator is thicker than the inter-electrode insulating film.

16. The nonvolatile semiconductor memory according to claim 15, wherein
the inter-electrode insulating film has a slit on the isolation insulating film,
the control gate electrode is in contact with the upper surface of the isolation insulating film through the slit.

17. The nonvolatile semiconductor memory according to claim 15, wherein
the inter-electrode insulating film has a slit on the isolation insulating film,
a second insulator is provided in the slit between the control gate electrode and the isolation insulating film, and
the second insulator is lower in dielectric constant than the inter-electrode insulating film.

18. The nonvolatile semiconductor memory according to claim 15, wherein
the inter-electrode insulating film has a slit on the isolation insulating film,
an air gap is provided between the control gate electrode and the isolation insulating film.

19. The nonvolatile semiconductor memory according to claim 15, wherein
the inter-electrode insulating film has a multilayer structure including a plurality of insulating films.

20. The nonvolatile semiconductor memory according to claim 19, wherein
the inter-electrode insulating film has a lowermost insulating film, an uppermost insulating film, and a middle insulating between the lowermost insulating film and the uppermost insulating film,
a dielectric constant of the lowermost insulating film and the uppermost insulating film is less than or equal to that of the middle insulating films.

21. The nonvolatile semiconductor memory according to claim 20, wherein
the inter-electrode insulating film has a slit on the isolation insulating film, and
the slit is provided in the inter-electrode insulating film so that the lowermost insulating film remains.

22. The nonvolatile semiconductor memory according to claim 15, wherein
a dielectric constant of the first insulator is less than or equal to that of the inter-electrode insulating film.

* * * * *